(12) United States Patent
Narwal et al.

(10) Patent No.: US 7,394,291 B2
(45) Date of Patent: Jul. 1, 2008

(54) HIGH VOLTAGE TOLERANT OUTPUT BUFFER (75) Inventors: Rajesh Narwal, Karnal (IN); Manoj Kumar, Madangir (IN)

(73) Assignee: STMicroelectronics Pvt. Ltd., Greater Noida, UP (IN)

( * ) Notice: Subject to any disclaimer, the term of this patent is extended or adjusted under 35 U.S.C. 154(b) by 0 days.

(21) Appl. No.: 11/615,680

(22) Filed: Dec. 22, 2006

(65) Prior Publication Data

US 2007/0170955 A1    Jul. 26, 2007

(30) Foreign Application Priority Data

Dec. 26, 2005    (IN)    .................. 3473/DEL/2005

(51) Int. Cl.
H03K 19/0175    (2006.01)
(52) U.S. Cl. .......................................... 326/81; 326/83
(58) Field of Classification Search .................. 326/26, 326/27, 80–87
See application file for complete search history.

(56) References Cited

U.S. PATENT DOCUMENTS

| 6,150,843 | A | 11/2000 | Shiffer et al. | |
| 6,310,492 | B1 * | 10/2001 | Ikoma et al. | 326/81 |
| 6,577,163 | B1 * | 6/2003 | Waldrip et al. | 326/81 |
| 6,768,339 | B2 * | 7/2004 | Von Thun et al. | 326/81 |

* cited by examiner

*Primary Examiner*—Don Le
(74) *Attorney, Agent, or Firm*—Hogan & Hartson LLP (57) ABSTRACT A high voltage tolerant output buffer uses a substrate voltage control circuit to control the voltage at the substrate of the transistors in the output buffer. The circuitry of output buffer is such that the voltage between any two terminals of any of the transistors is not allowed to exceed the supply voltage of the output buffer. At the same time, the voltage at the source or drain of transistors of output buffer is not allowed to increase beyond its substrate voltage. The proposed circuit for output buffer can tolerate voltages higher than the voltage at which it is operated. The novel circuitry uses less hardware and prevents power dissipation in the circuit.

9 Claims, 11 Drawing Sheets

HIGH VOLTAGE TOLERANT OUTPUT BUFFER

RELATED APPLICATION

This application claims priority of India Patent Application No. 3473/Del/2005 filed Dec. 26, 2005, which is incorporated herein in its entirety by this reference.

FIELD OF THE INVENTION

The present invention relates to the field of I/O buffers for integrated circuits, and more particularly to an output buffer capable of tolerating high voltages.

BACKGROUND OF THE INVENTION

An integrated circuit (IC) package has a number of components present on a single chip to perform a specific function. Apart from the basic circuitry, each IC package has a I/O block associated with it. The function of this I/O block is to interface with other IC packages or electrical devices. A bidirectional I/O block comprises of an input buffer and an output buffer, both connected to an I/O pad. When the I/O block is used in input mode, the input buffer is in driving mode whereas the output buffer is tristated. On the other hand, when the I/O block is used in output mode, the output buffer is in driving mode whereas the input buffer is tristated.

Conventionally, IC packages utilize 0 and 5 volts voltage levels to represent "0" and "1" logic states respectively. However, with advancement in technology, these voltage levels have undergone a change. For example in many current IC devices manufactured by submicron semiconductor fabrication processes, a voltage level of 3.3 volts is used instead of 5 volts to represent logic state "1". This reduction in the voltage level has lead to reduced power dissipation and hence improved performance of the IC devices.

Figure 1A:
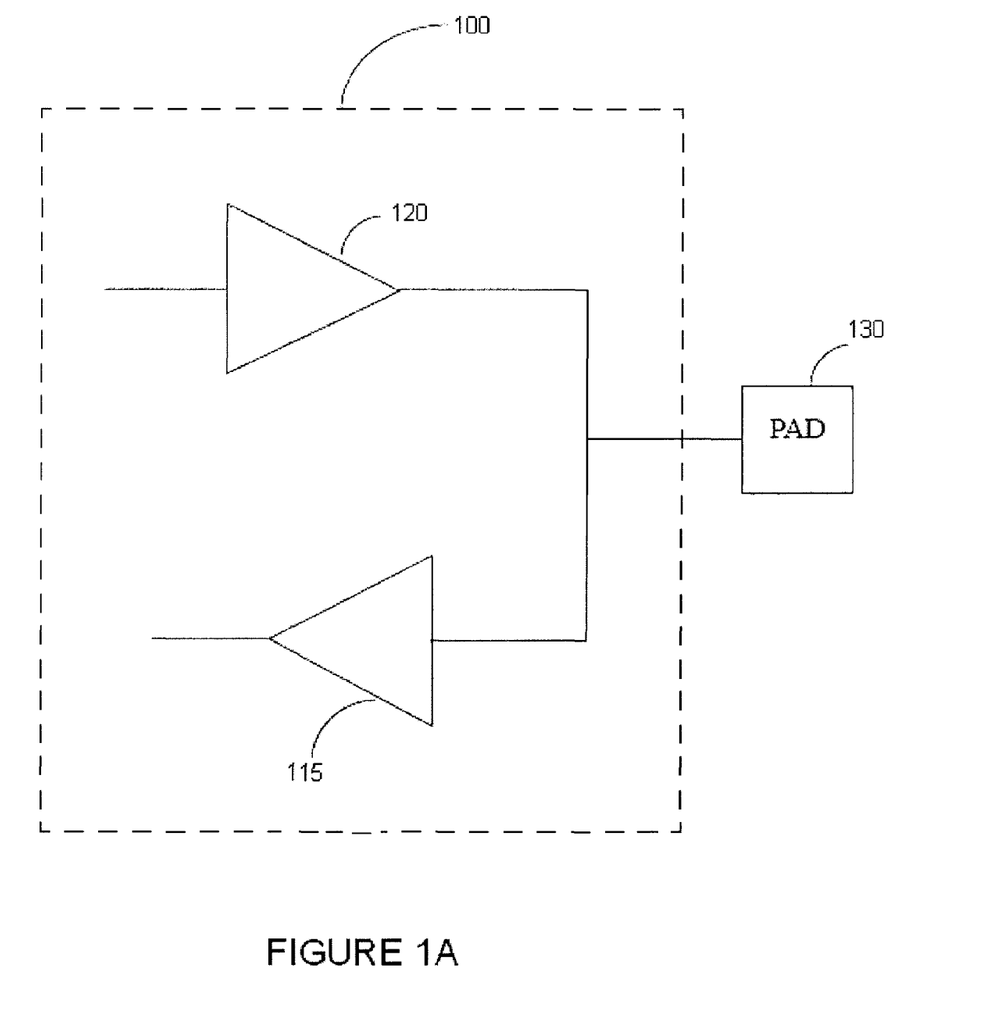
FIG. 1A shows a basic block diagram of a bidirectional input-output block.
Figure 1B:
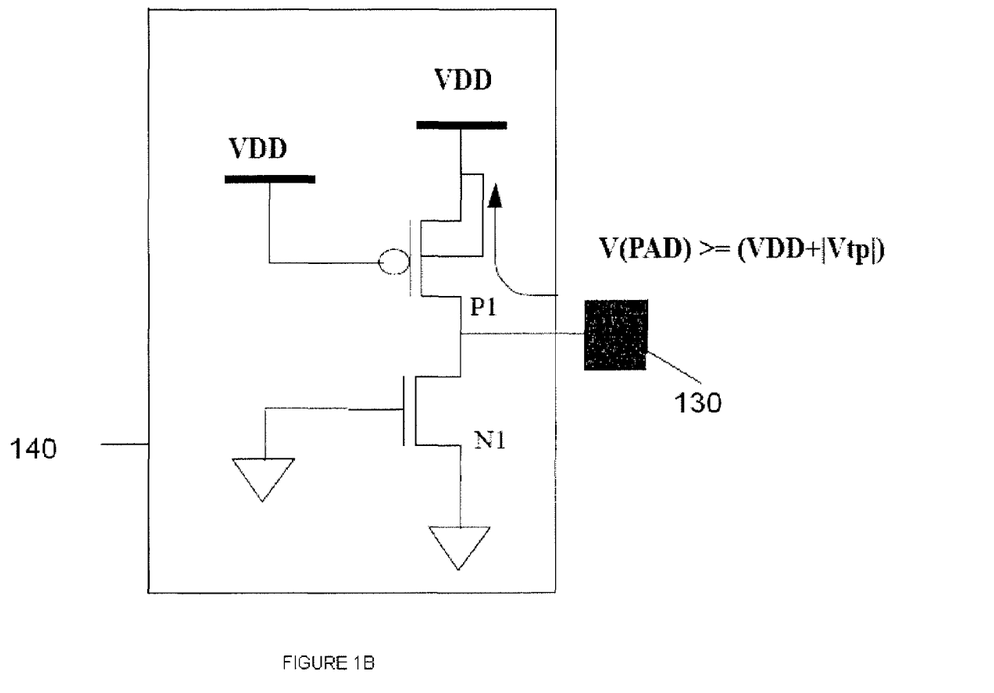
FIG. 1B shows schematic of a conventional pad driver of output buffer with pad.
Figure 1C:
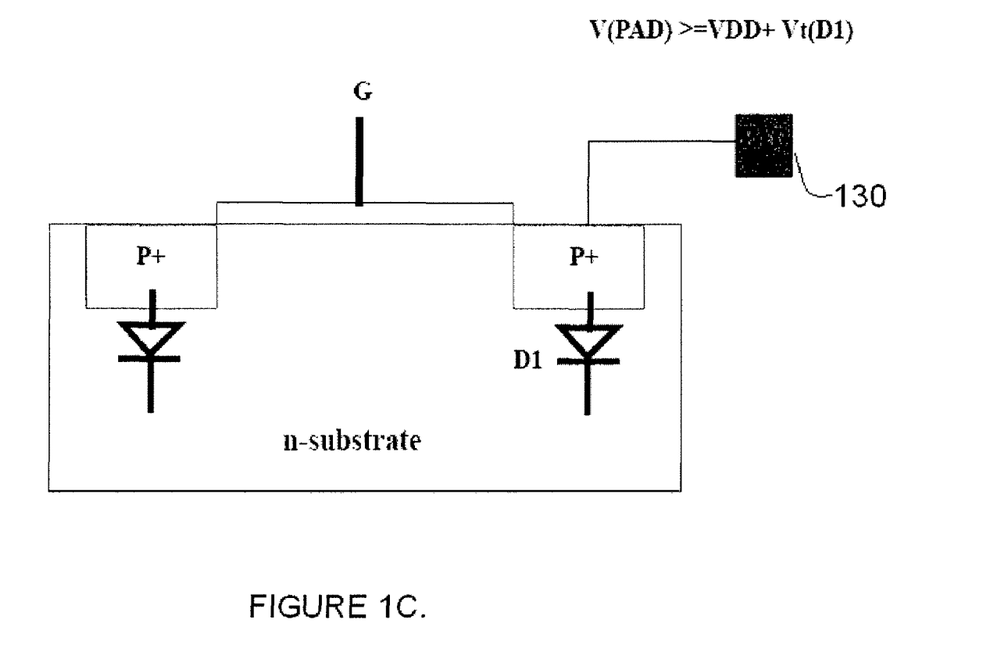
FIG. 1C shows a cross sectional view of a PMOS transistor with parasitic diodes.

With the introduction of lower voltage levels, present day IC devices work in mixed mode operation. In such a mode, circuits operating at 3.3 volts and 5 volts are coupled together. The complete logic circuit has tristate buffers operating at 3.3 volts and 5 volts. The problem associated with this type of operation is that tristate buffer operating at 3.3 volts may not be able to tolerate a 5 volts voltage level. This is explained in detail with reference to FIG. 1A, 1B and 1C. FIG. 1A shows a bidirectional I/O block. The I/O block (100) comprises of an input buffer (115) and an output buffer (120). Both the buffers are connected to a PAD (130). FIG. 1B shows a schematic of a conventional pad driver (140) of output buffer with PAD (130). In the present configuration, if the voltage at the pad (130) (VPAD) rises to (VDD+|Vtp|) where VDD is the supply voltage of the output buffer and Vtp is the threshold voltage of the PMOS, the PMOS P1 starts conducting and current starts flowing from pad to VDD. This results in power dissipation. FIG. 1C shows a detailed structure of PMOS (P1). The substrate of PMOS (P1) is connected to VDD and if the voltage at the pad increases to (VDD+Vt), where Vt is the threshold voltage of the diode D1, the diode D1 gets forward biased. This results in substrate current flow. Moreover, if the voltage across any transistor increases beyond a critical limit, the gate oxide of both PMOS and NMOS may break down. Hence it is required that |Vgs| or |Vgd| do not exceed VDD, where Vgs and Vgd are the gate to source and gate to drain voltages respectively.

In order to overcome the above mentioned problems in conventional I/O buffers, a tolerant I/O buffer is disclosed in U.S. Pat. No. 6,150,843 issued to Shiffer et al. The 5 volt tolerant I/O buffer circuit is coupled to a power supply terminal of a predetermined power supply voltage for driving an I/O pad to a logic state depending on an input signal and an output enable signal. The I/O buffer circuit minimizes current flow into the power supply terminal when the pad is coupled to a voltage greater than the predetermined power supply voltage. A driver transistor of a first type is formed within diffusion well and is coupled to the predetermined power supply voltage and to the pad. First and second terminals of a protection transistor are coupled to respective ones of the predetermined power supply voltage and the diffusion well. When the output enable signal is active, protection transistor is turned on so as to couple the predetermined power supply voltage to the diffusion well, regardless of a voltage level of the pad.

Figure 2:
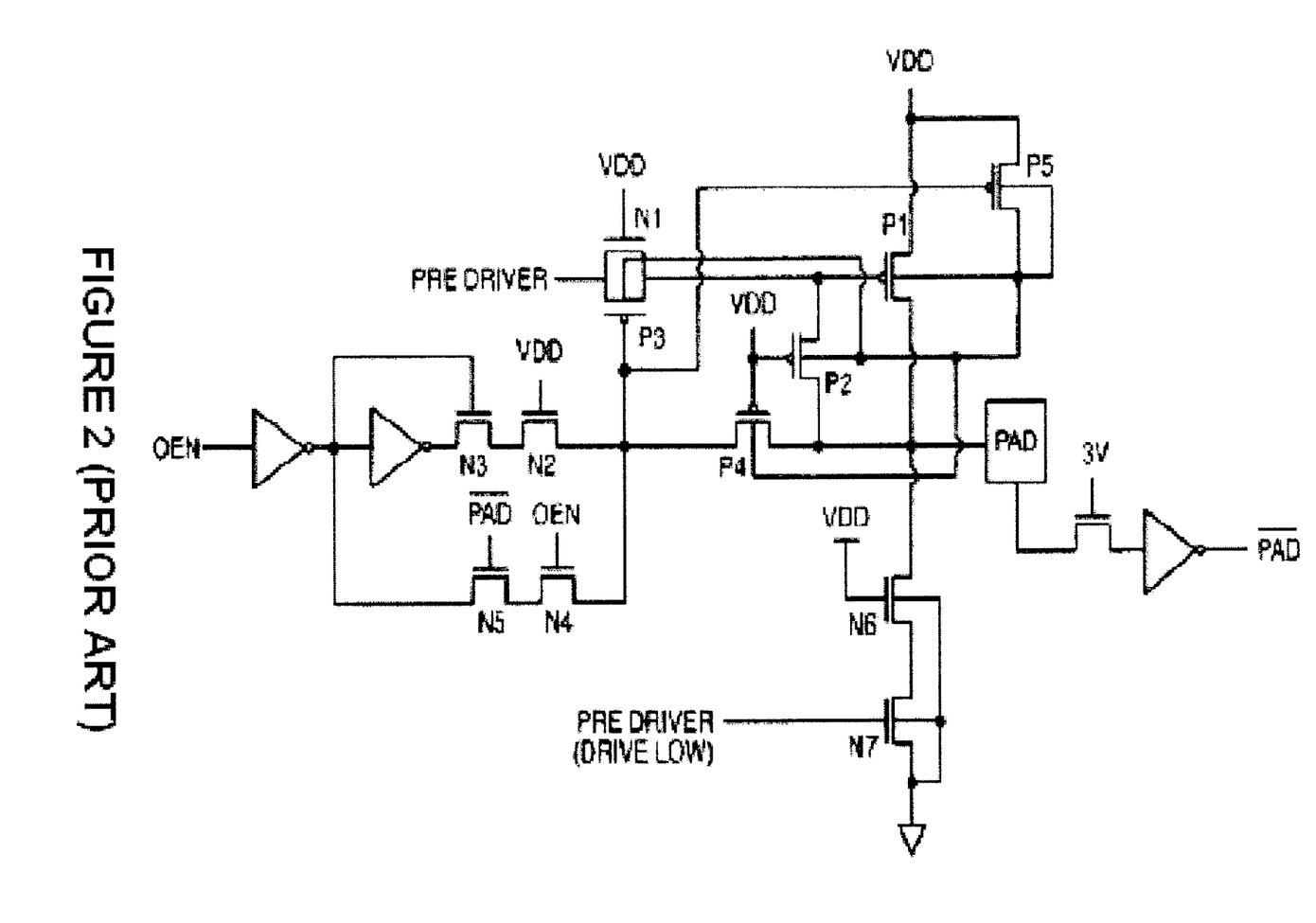
FIG. 2 shows the prior art circuit for 5V tolerant output buffer.

The I/O buffer in the above-described circuitry is tolerant to a voltage signal of strength 5 volts. However, the circuit faces one problem. The inverter connected to PAD dissipates power since its PMOS never becomes completely off. The circuit for 5V tolerant output buffer as disclosed by the prior art has been shown in FIG. 2. In order to make an I/O buffer 5 volt tolerant, the P driver of the I/O buffer should always be in cutoff mode when the output enable signal is inactive. As shown in FIG. 2, when the pad is at 5 volts, if the gate of the P driver P1 is at 3 volts or less, then the transistor P1 is turned on. However, this is not desired. Therefore, when the pad is at 5 volts, the gate of the transistor P1 should also be at 5 volts. This is achieved by adding a P transistor P2 as shown in FIG. 2. When the pad is at 5 volts, the transistor P2 turns on such that the gate of the transistor P1 is also at 5 volts. As a result, the transistor P1 gets into cutoff mode. A pass gate comprising of transistors N1 and P3 is provided in the circuit as shown in FIG. 2. The function of this pass gate is to isolate the 5 volt potential at the gate of the transistor P1 from predriver logic. A P transistor P4 is present between the pad and the gate of the transistor P3. Transistor P4 passes 5 volts to the gate of P3 when the pad is at 5 volts. This helps to block leakage into the predriver whenever there is 5 volts at the gate of the transistor P1. When the output enable signal is active low, the transistor P3 should pass 3 volts across the pass gate to the gate of the transistor P1. For this purpose, transistors N2 and N3 are connected in series as shown in FIG. 2. The output enable signal is input to this pair of transistors after passing through a pair of series connected inverters. The transistor N2 is always turned on since its gate is connected to VDD. The gate of the transistor N3 is connected to an intermediate node between the two inverters. As a result, the transistor N3 is turned on whenever the output enable signal is active low.

When the output enable signal is inactive, the pad may be at 0 volts. In that case, the transistor P1 should be placed in cutoff mode to prevent current leakage from VDD to the pad. For this purpose, a pair of series connected N type transistors N4 and N5 are provided in the circuit. When the pad is at 0 volts, these transistors N4 and N5 are ON and the gate of the transistor P3 is at 0 volts, this passes 3 volts to the gate of the transistor P1, turning it off. A transistor P5 is coupled between the supply voltage VDD and the N well in which each of the P transistors is formed. This transistor blocks the leakage path through the bulk. Series connected N type transistors N6 and N7 coupled from pad to ground form the N driver pull down circuitry as shown in FIG. 2.

The above mentioned circuitry provides tolerance whenever an I/O pad is driven by an external device to a voltage level higher than that to which it is driven by the I/O buffer. However, the PMOS of the inverter connected to PAD never becomes completely off. As a result, the inverter dissipates power.

In order to overcome the above mentioned problems faced by the prior art, the present invention discloses a circuit for high voltage tolerant output buffer. The circuit comprises of an input (110) coming from predriver, an output buffer (120) and a pad (130). Apart from this, the circuit is connected to a substrate voltage controlling circuit (140) and an inverter (150).

Therefore, there arises a need for an output buffer which is tolerant to high voltage and which causes less power dissipation.

SUMMARY OF THE INVENTION

An object of the present invention is to provide a high voltage tolerance output buffer in an IC package that dissipates less power. It is another object of the present invention to provide a high voltage output buffer that uses less hardware and is hence cost advantageous.

The instant invention provides a high voltage tolerant output buffer comprising an output buffer circuitry for receiving signal from a predriver, an input/output PAD connected to the output buffer circuitry, a substrate voltage control circuit for maintaining the voltage (S) at the substrate of transistors of the output buffer circuitry, a signal M which determines the mode of operation of the output buffer, and an inverter for generating a signal (W) by inverting the signal M, wherein the voltage between any two terminals of any of the transistors of the output buffer circuitry never exceeds VDD where VDD is the operating voltage of the output buffer.

The above mentioned object of the present invention is achieved by providing a novel circuitry for an output buffer. A circuit comprising of transistors is used to control the voltage at the substrate of the transistors in the output buffer circuitry. The circuitry of output buffer is such that the voltage between any two terminals of any of the transistors is not allowed to exceed the supply voltage of the output buffer (VDD). At the same time, the voltage at the source or drain of transistors of output buffer is not allowed to increase beyond its substrate voltage. The proposed circuit can tolerate high voltages say 5V if VDD is 3.3V or 2.5 V, or 3.3V if VDD is 2.5 V.

DETAILED DESCRIPTION OF THE INVENTION

Figure 3:
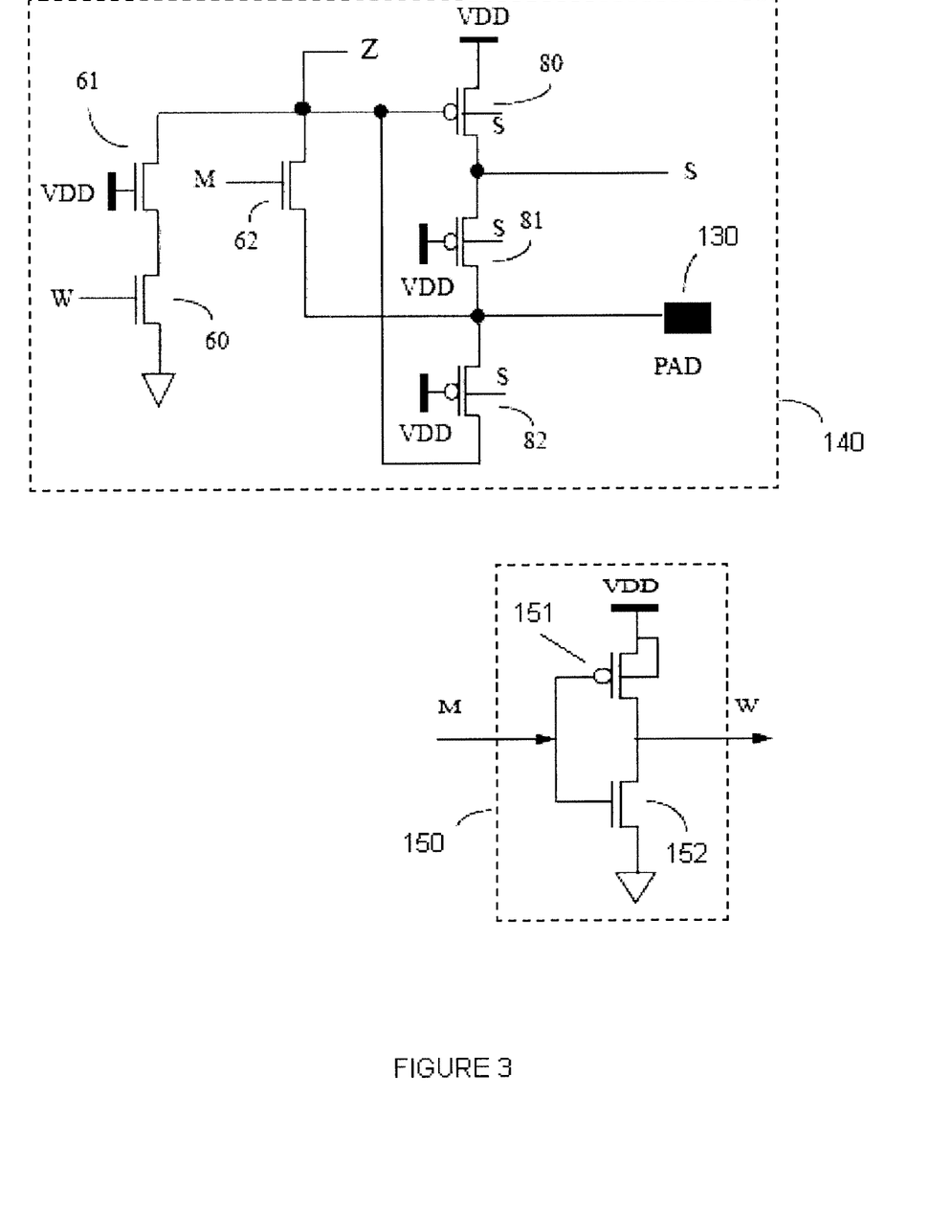
FIG. 3 shows a schematic of substrate voltage control circuit along with an inverter as disclosed by present invention.

The circuit for generating substrate voltage (140) is shown in FIG. 3. It comprises of three NMOSs (60), (61) and (62) and three PMOSs (80), (81) and (82). The source of (60) is connected to ground while its gate is connected to W. The drain of (60) is connected to one of the terminals of (61) while the gate of (61) is connected to VDD. The second terminal of (61) is connected to node Z, the gate of (80). The NMOS (62) is connected between PAD (130) and Z. (80) is connected in between VDD and substrate voltage terminal S. (81) is connected between S and PAD (130). The gate of (81) is connected to VDD. The PMOS (82) is connected between PAD (130) and the gate of (80). The gate of (82) is connected to VDD and the bulk of (80), (81) and (82) are connected to S. The inverter (150) is also shown in FIG. 3. It comprises of PMOS (151) and NMOS (152). The drains of (151) and (152) are connected to W. The source and bulk of both (151) and (152) are connected to VDD and ground respectively.

Figure 4:
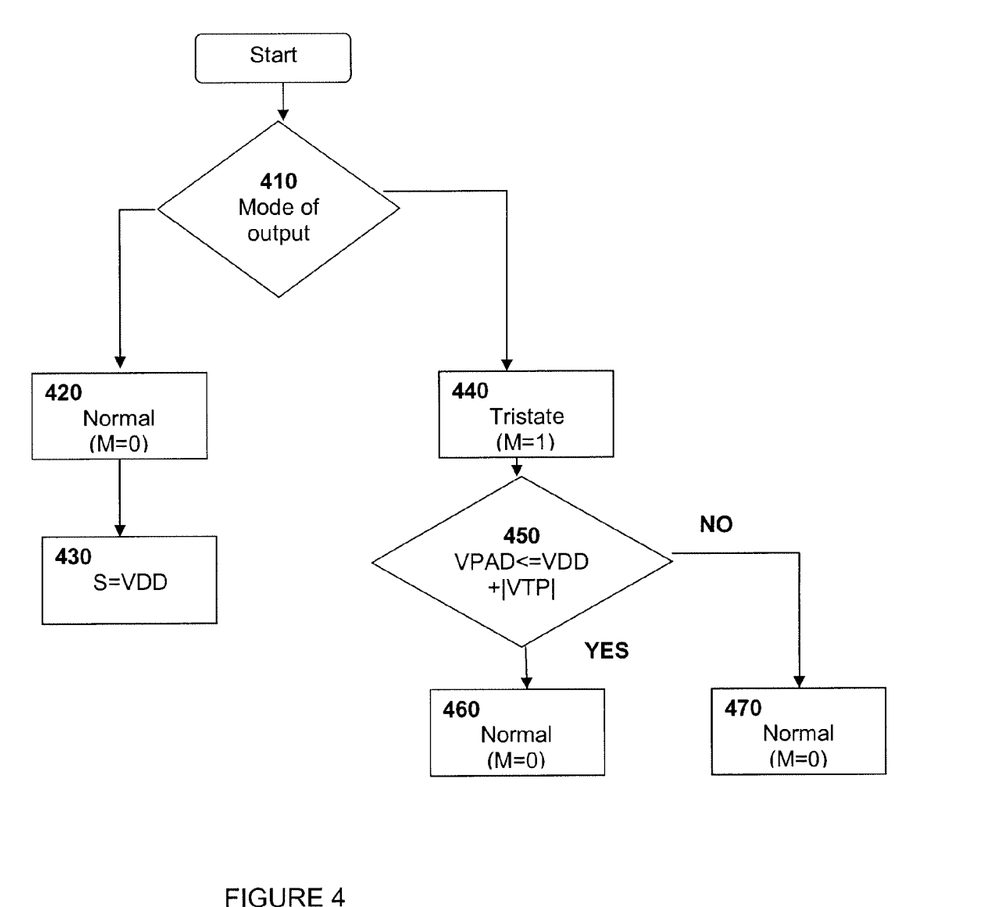
FIG. 4 shows a flow chart explaining the working of substrate control circuit of FIG. 3.

The working of the substrate voltage control circuit (140) is shown in the form of a flowchart in FIG. 4. Consider the case when M=0 (as shown in 420). In the substrate voltage control circuit, W=VDD. (60) and (61) both are conducting and pull down the gate of (80). Also, (62), (81) and (82) remain off. The PMOS (80) is ON and pulls up S to VDD. This is shown in the block (430). On the other hand, when M=VDD, W=0 (as shown in 450). In this case, (60) remains off while (62) is conducting. Consider a transition at PAD from 0 volts to 5 volts. During transition from 0 to VDD+|Vtp|, the voltage at the gate of PMOS (80) varies from 0 to VDD−|Vtp|. This voltage keeps (80) ON and voltage at S remains at VDD. During this period (81) and (82) remain OFF. When the voltage at the PAD varies from VDD to 5 volts, as soon as the voltage becomes VDD+|Vtp|, (81) and (82) both become ON. The PMOS (82) pulls up the gate of (80) to PAD voltage. As soon as the voltage at the gate of (80) reaches above VDD+|Vtp|, both (80) and (62) become OFF. S is connected to PAD (130) via (81). Therefore, for a voltage 0 to VDD+Vtp, the substrate voltage remains at VDD (shown in 460) while above VDD+Vtp substrate voltage follows the PAD (130) (as shown in 470).

The behavior of various transistors in the substrate voltage control circuit (140) is shown in Table 1.

TABLE 1

Behavior of substrate voltage control circuit

| M | W | S | State of different transistors |
|---|---|---|---|
| 0 | VDD | VDD | 60,61,80 ON<br>62,81,82 OFF |
| VDD<br>(PAD varies from 0<br>to VDD+|Vtp|) | 0 | VDD | 80,61,62 ON<br>60,81,82 OFF |
| VDD<br>(PAD varies from<br>VDD+|Vtp| to 5) | 0 | Follows<br>PAD voltage | 81,82,61 ON<br>60,80,62 OFF |

Figure 5:
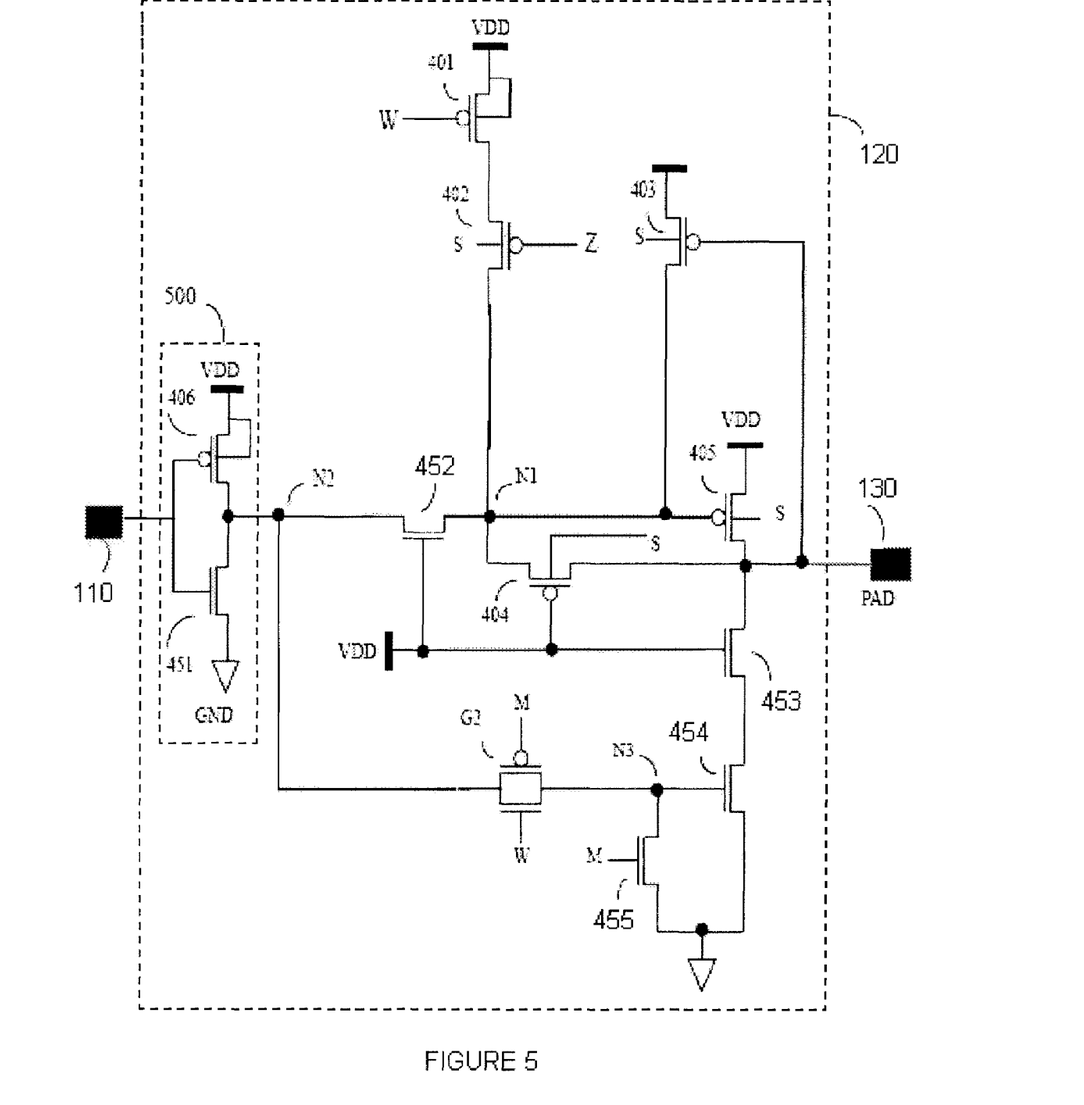
FIG. 5 shows the first embodiment of the present invention.

FIG. 5 shows the complete structure of the output buffer (120). It comprises of 6 PMOSs ((401), (402), (403), (404), (405) and (406)) and 5 NMOSs ((451), (452), (453), (454) and (455)). The gate of (406) is connected to the input (110). Its source and bulk are connected to VDD while its drain is connected to the drain of (452). The gate of (451) is connected to (110) and its source is grounded. The bulk of all NMOSs are connected to ground. The NMOS (452) is connected in series between nodes N1 and N2. The gate of (452) is connected to VDD. A transmission gate G2 is placed between nodes N2 and N3. The NMOSs (453) and (454) are placed in series between PAD (130) and ground. The gate of (453) is connected to VDD while the gate of (454) is connected to node N3. The NMOS (454) is placed between node N3 and ground and its gate is connected to M. The PMOS (405) is connected between VDD and PAD (130). The gate of (405) is connected to node N1 and its substrate is connected to S. (404) is connected between N1 and PAD (130). Its gate and substrate are connected to VDD and S respectively. The gate of (401) is connected to W. (401) and (402) are connected in series between node N1 and VDD. Their bulks are connected to VDD and S respectively. The gate of (402) and (403) are connected to Z and PAD respectively. The bulk of (403) is connected to S.

The working of output buffer (120) depends on signal M. When signal M is 0, (120) operates in the OUTPUT mode and works as a normal output buffer. When the signal M is high i.e. equal to VDD, then the output buffer (120) is tristated and the PAD (130) works in the INPUT mode.

In the first case consider a stable condition with INPUT=PAD=0. Now when the input (110) makes a transition from 0 to VDD, (451) is turned ON and (406) OFF. The output of inverter (500) is 0 which is connected to node N2. The gate of (452) is connected to VDD which makes (405) ON. (455) is OFF since its gate is connected to M=0. The transmission gate G2 passes 0 from N2 to the gate of (454) which makes it OFF. The gate of (401) is connected to W=VDD which keeps (401) OFF. The gate of (403) is connected to PAD (130). As the voltage at PAD starts increasing, the resistivity of (403) starts increasing and eventually it becomes OFF as the voltage on PAD reaches VDD−Vtp, where Vtp is the threshold voltage of (403). In the output mode Z is always 0. This keeps (402) always ON. With (401) OFF and (402) ON, node N1 is not connected to VDD. The gate of (453) is connected to VDD so it remains always ON. Hence, PAD (130) is pulled up to VDD through (405).

Now consider a case when output buffer is operating in OUTPUT mode and INPUT=PAD=VDD. When input (110) makes a transition from VDD to 0, inverter (500) toggles making node N2 VDD. Now, (452) is ON with its drain at VDD. The voltage at N1, i.e. the source of (452) is VDD−Vtn. (405) is now conducting in sub threshold region. The NMOS (453) is always conducting since its gate is connected to VDD. Transmission gate G2 allows voltage at N2 (VDD) to reach to the gate of (454). This makes (454) ON. With both (453) and (454) ON and (405) in subthreshold region, PAD starts discharging. Reduction in voltage at PAD results in reduction of voltage at gate of (403). This makes (403) completely ON. Node N1 is then pulled at VDD hence making (405) completely OFF. Eventually PAD (130) reaches 0.

Now consider the case when PAD (130) is working in input mode. In this mode of operation, the output buffer (120) is tristated and the voltage at input (110) remains at 0 volt which keeps N2 at VDD. Input voltage at PAD (130) can vary from 0 to 5 volt. Since W=0, (401) is always ON. Voltage at Z is also 0 volt which keeps (402) ON. With 0 volt at (130), (403) is also ON. With (401), (402) and (403) ON, node N1 remains at VDD. Since both N1 and N2 are at VDD, this makes (452) OFF. As a result, (405) is also OFF. With M=1 and W=0, transmission gate G2 is OFF, thus isolating node N2 from the gate of (454). M=VDD makes (455) ON. This makes node N3 0 volt and (454) OFF. Substrates of all PMOSs remain at VDD. Increase in the voltage at PAD (130) results in increase in gate voltage of (403). When PAD voltage increases to VDD, (403) becomes OFF. At this point (402) conducts in subthreshold region which keeps N1 at VDD. As soon as the voltage at PAD (130) increases to VDD+|Vtp|, voltage at Z becomes same as PAD (130). This makes (402) OFF. Since the gate of (404) is at VDD, as the voltage at PAD becomes VDD+|Vtp|, (404) becomes ON. This takes N1 to PAD voltage. (404) passes the voltage at PAD to the gate of (405). Node N1 becomes the source for (402). Now since gate and source of (402) are at same voltage, (402) becomes OFF. PAD (130) becomes the source for (405). The gate and source voltage of (405) are same, this keeps (405) OFF. When the voltage at PAD (130) reaches to 5 volt, (404) shorts PAD to node N1. (402), (403) and (405) are OFF since their gate and source are at 5 volt.

In the proposed circuitry, the voltage between any two terminals of any of the transistors never exceeds VDD. NMOS (453) protects (454) from high voltage at PAD. Thus the present invention provides a circuitry for a 5 V tolerant output buffer which is operating on a supply voltage of 2.5 V or 3.3 V.

Figure 6:
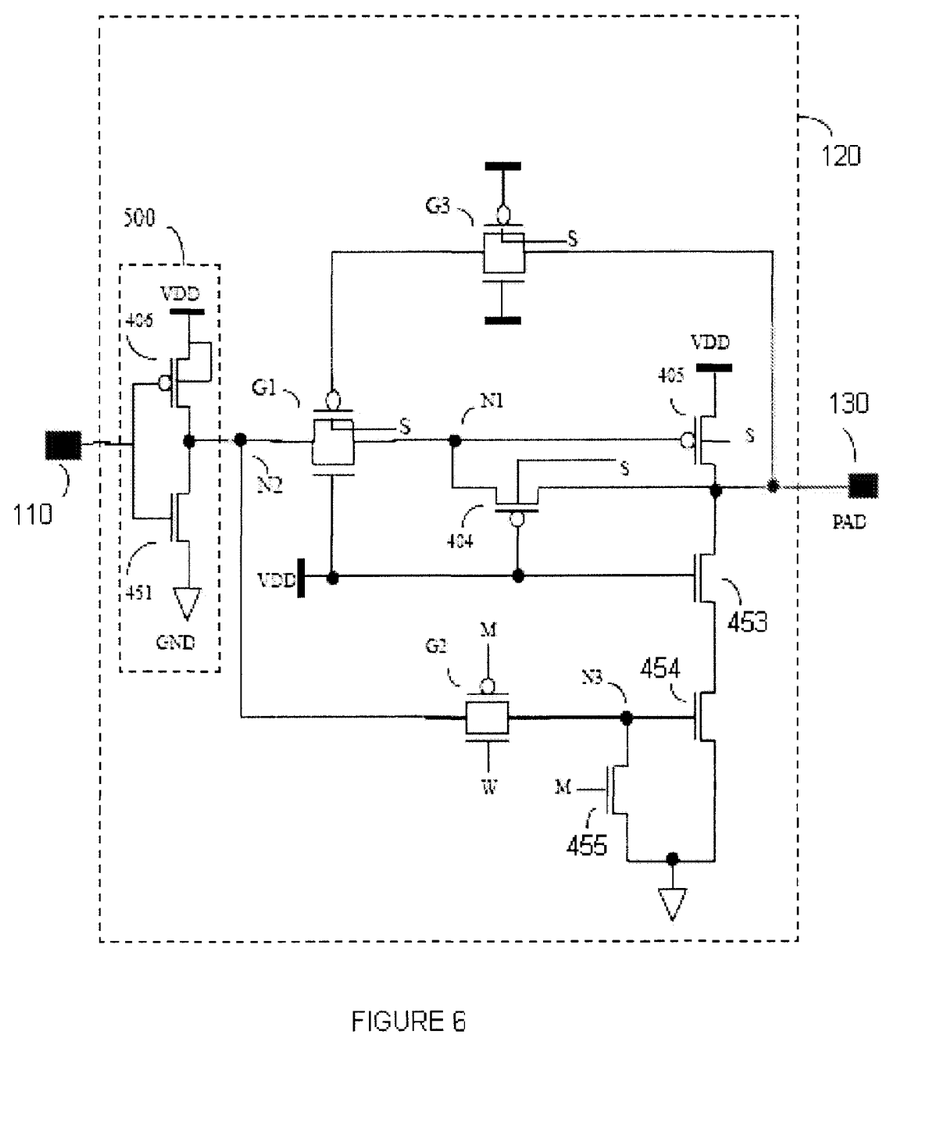
FIG. 6 shows the second embodiment of the present invention

FIG. 6 shows another embodiment of the present invention. In this embodiment the PMOSs (401), (402) and (403) are replaced by transmission gate G3. Both PMOS and NMOS of G3 are connected to VDD. The NMOS (452) is also replaced by a transmission gate G1. NMOS gate of G1 is connected to VDD while gate of PMOS is connected to one of the terminal of G3. The second terminal of G3 is connected to the PAD (130).

When the signal M=0, the PAD (130) operates in the OUTPUT mode. The operation of substrate voltage control circuit (140) is same as in the case of embodiment shown in FIG. 5. Consider a stable condition with INPUT=PAD=0. Now when input (110) makes a transition from 0 to VDD, (451) becomes ON and (406) OFF. The output of inverter (500) is 0 which is connected to node N2. G3 transmits 0 at the gate of PMOS of G1. G1 passes 0 from node N2 to N1 which makes (405) ON. (455) is OFF since its gate is connected to M=0. G2 passes 0 from N2 to the gate of (454) which makes it OFF. As the voltage at PAD (130) starts increasing, the voltage at the gate of PMOS of G1 also increases. It becomes VDD−Vtn as the voltage on PAD (130) reaches VDD. At this point, PMOS of G1 conducts in subthreshold region. Now consider a condition when INPUT=PAD=VDD. PMOS of G1 conducts in the subthreshold region. As input (110) makes a transition from VDD to 0, inverter (500) toggles making the node N2 VDD. G1 transmits this VDD to node N1. (453) is always conducting since its gate is connected to VDD. G2 allows voltage at N2 (VDD) to reach to the gate of NMOS (454). This makes (454) ON. With both (453) and (454) ON and (405) in subthreshold region, PAD starts discharging. Reduction in voltage at PAD results in reduction of voltage at the gate of PMOS of G1. This makes PMOS completely ON. Node N1 is pulled at VDD hence making 05 completely OFF. Eventually PAD (130) reaches to 0.

When the signal M=VDD, W=0. The PAD (130) operates in the INPUT mode and the output buffer (120) is tristated. The operation of substrate voltage control circuit (140) is same as in the case of embodiment shown in FIG. 5. The input to circuit (150) is M=VDD and its output is W=0. In this mode of operation, the voltage at input (110) remains at 0 volts which keeps N2 at VDD. Input voltage at PAD (130) can vary from 0 to 5 V. With 0V at (130). G3 transmits this 0 to the gate of PMOS of G1, which keeps G1 ON. G1 transmits voltage at N2 (VDD) to N1 which keeps (405) OFF. With M=1 and W=0, transmission gate G2 is OFF, thus isolating node N2 from the gate of NMOS (454). M=VDD makes (455) ON. This makes node N3 0V and NMOS (454) OFF. Substrate of all the PMOSs remains at VDD. Increase in the voltage at PAD (130) results gate voltage of PMOS of G1 to increase. As PAD voltage increases to VDD, voltage at the gate of PMOS of G1 becomes VDD−Vtn. At this point PMOS of G1 conducts in subthreshold region which keeps N1 at VDD. As soon as the voltage at PAD (130) increases to VDD+|Vtp|, PMOS of G3 starts conducting. This shorts PAD (130) and gate of PMOS of G1. Also the gate of (404) is at VDD, as the voltage at PAD becomes VDD+|Vtp|, (404) becomes ON. This takes N1 to PAD voltage. Now gate of G1 is at PAD voltage. One terminal is at VDD (N2) and other terminal is at PAD voltage. This keeps PMOS of G1 OFF. When the PAD voltage crosses VDD+|Vtp|, NMOS of G1 also becomes OFF. For PMOS (405) PAD (130) becomes the source. The gate and source voltage of PMOS (405) are same which keeps (405) OFF. NMOS (453) protects (454) from high voltage at PAD.

Figure 7:
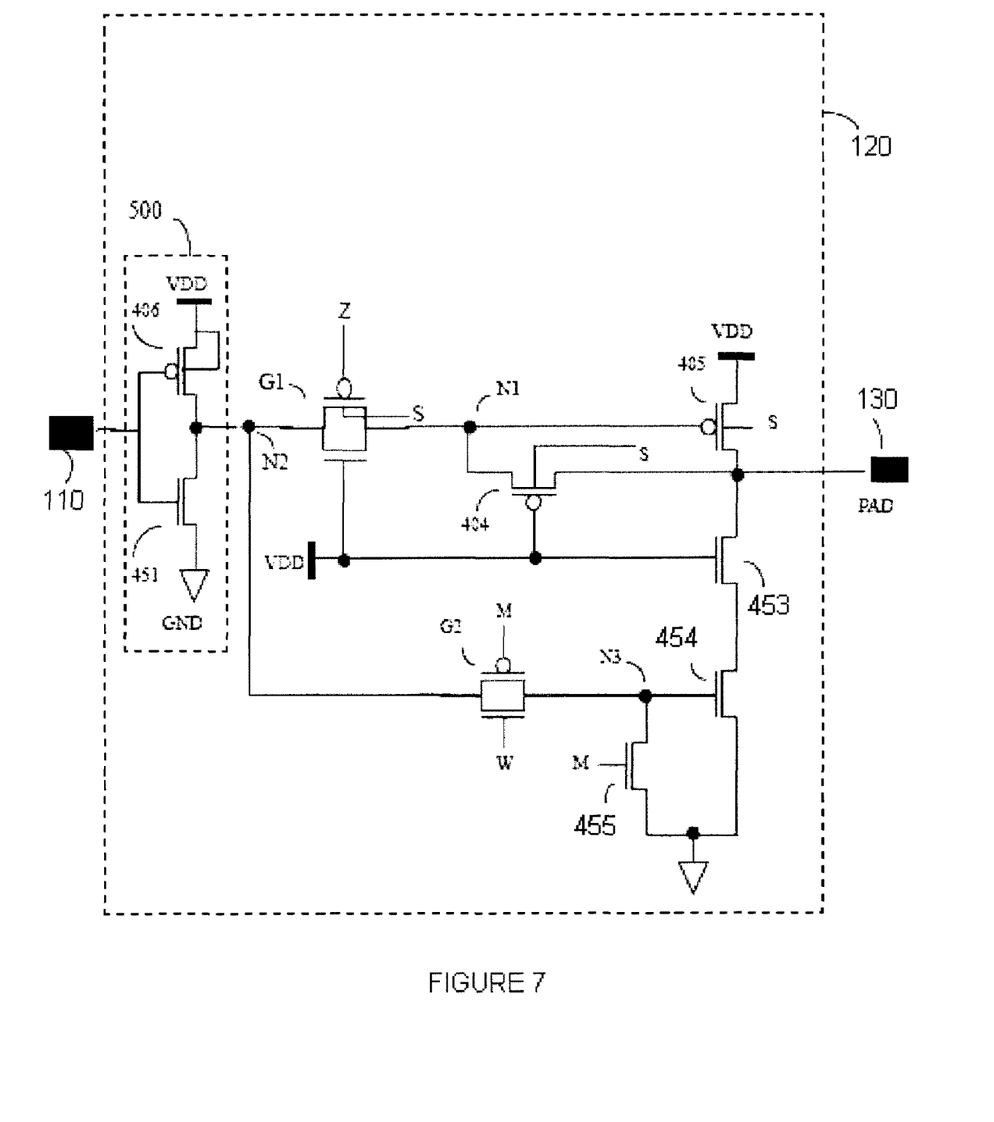
FIG. 7 shows the third embodiment of the present invention.

FIG. 7 shows output buffer (120) according to another embodiment of the present invention. In this embodiment, transmission gate G3 is omitted. NMOS gate of G1 is connected to VDD while gate of PMOS is connected to Z generated by block (140).

When signal M=0, the circuit (120) works as a normal output buffer. Operation of substrate voltage control (140) remains same as described in the previous embodiments. In the output mode Z=0. Consider a stable condition with INPUT (110)=PAD=0. Now when INPUT (110) makes a transition from 0 to VDD, (451) is turned ON and (406) OFF. The output of inverter (500) is 0 which is connected to node N2. Transmission gate G1 passes 0 from node N2 to N1 which makes (405) ON. Transmission gate G2 passes 0 from N2 to the gate of (454) which makes it OFF. Ultimately PAD is pulled up to VDD. In case when INPUT (110)=PAD=VDD and when INPUT (110) makes a transmission from VDD to 0, inverter (500) toggles. This makes node N2 VDD. Transmission gate G1 transmits VDD to node N1. NMOS (453) is always conducting as its gate is connected to VDD. Transmission gate G2 allows voltage at N2 (VDD) to reach to the gate of NMOS (454). This makes (454) ON. With both (453) and (454) ON and (405) OFF, PAD node starts discharging. Eventually PAD (130) reaches to 0.

When signal M=VDD, the output buffer (120) is tristated. In this mode M=VDD and W=0. The Operation of substrate voltage control (140) remains same as described in the previous embodiments. Voltage a Z remains 0V until the voltage at PAD remains between 0V and VDD+|Vtp| and it becomes same as the PAD above VDD+|Vtp|. The input to the inverter (150) is M=VDD and its output is W=0. In the input mode of operation, voltage at INPUT (110) remains at 0 V which keeps N2 at VDD. Input voltage at PAD (130) can vary from 0 to 5V. When PAD (130) is at 0V, G1 transmits voltage at N2 (VDD) to N1 which keeps (405) OFF. With M=1 and W=0, transmission gate G2 is OFF, thus isolating node N2 from the gate of (454). M=VDD makes (455) ON. This makes node N3 0V and (454) OFF. Substrate of all the PMOSs remains at VDD. As soon as the voltage at PAD (130) increases to VDD+|Vtp|, voltage at Z becomes same as the PAD voltage. Also, since the gate of (404) is at VDD, as the voltage at pad becomes VDD+|Vtp|, (404) becomes ON. This takes N1 to PAD voltage. Now gate of G1 is at PAD voltage, one terminal of G1 is at VDD (N2) and other terminal is also at PAD voltage. This keeps PMOS of G1 OFF. As the PAD voltage crosses VDD+|Vtp|, NMOS of G1 becomes OFF. PAD (130) becomes the source for (405). The gate and source voltage of PMOS (405) are same which keeps (405) OFF. (453) protects (454) from high voltage at PAD.

In the proposed circuitry, the voltage between any two terminals of any of the transistors never exceeds VDD. This prevents power dissipation and breakdown of gate oxide of PMOSs and NMOSs present in the circuit. Thus, the proposed circuit can tolerate high voltages say 5V if VDD is 3.3V or 2.5 V, or 3.3V if VDD is 2.5 V. Moreover, the circuit proposed by the present invention uses less hardware than the prior art.

Figure 8:
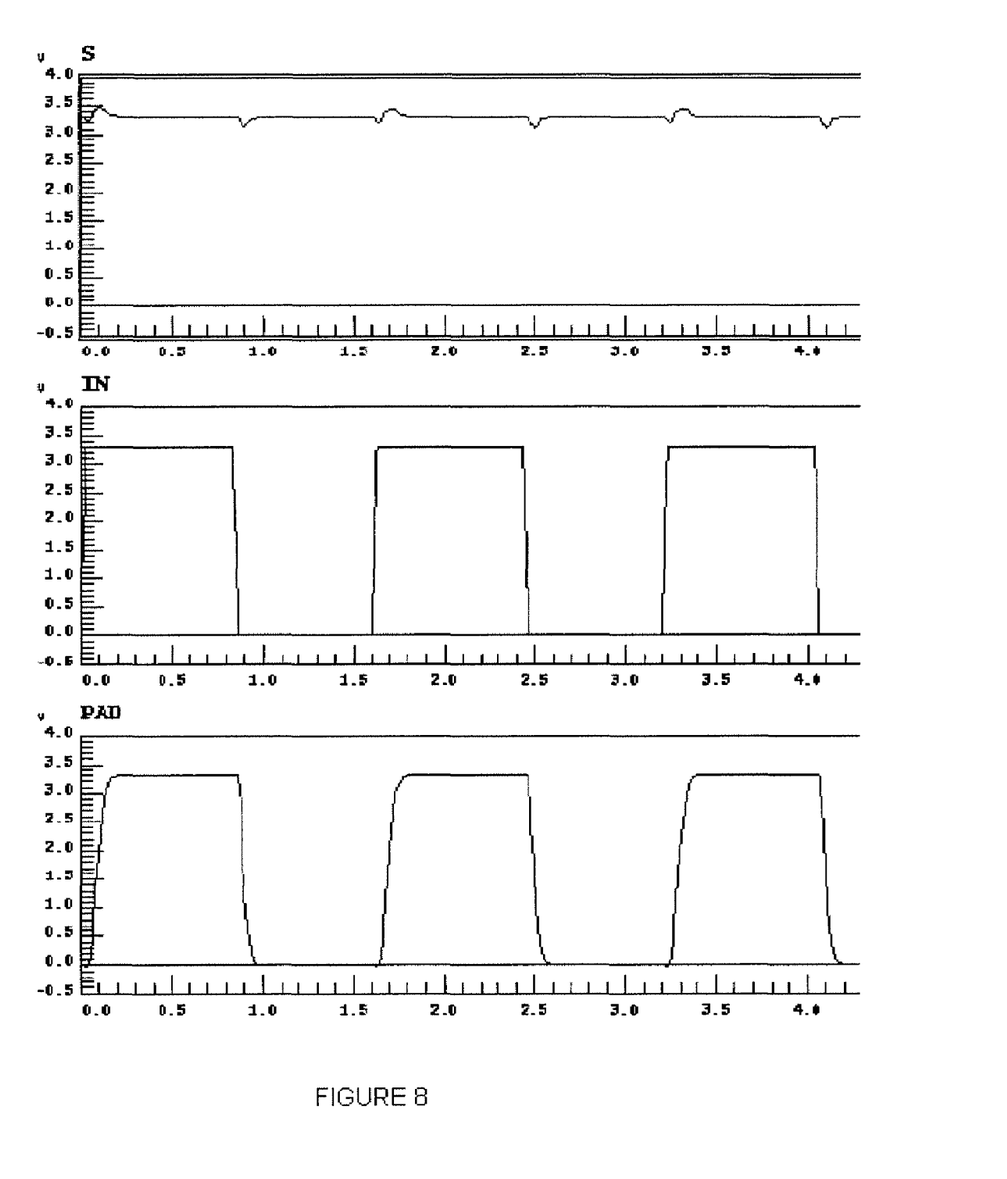
FIG. 8 shows simulation results obtained when output buffer is in driving mode.

FIG. 8 shows simulation results obtained when output buffer is working in normal driving mode. The first waveform S gives the variation in substrate voltage. The second waveform shows the variation of input voltage whereas the third waveform shows the variation of PAD voltage. In this mode of operation, the substrate voltage (S) is same as VDD. This is seen in the first waveform where S always remains equal to 3.3 V. When INPUT=PAD=0 V, and INPUT makes a transition from 0 to VDD, the voltage at PAD also increases from 0 to VDD. Similarly, when the INPUT voltage makes a transition from VDD to 0, voltage at PAD also eventually reaches 0. Thus, the waveform at PAD follows the waveform at INPUT. This is shown in FIG. 8.

Figure 9:
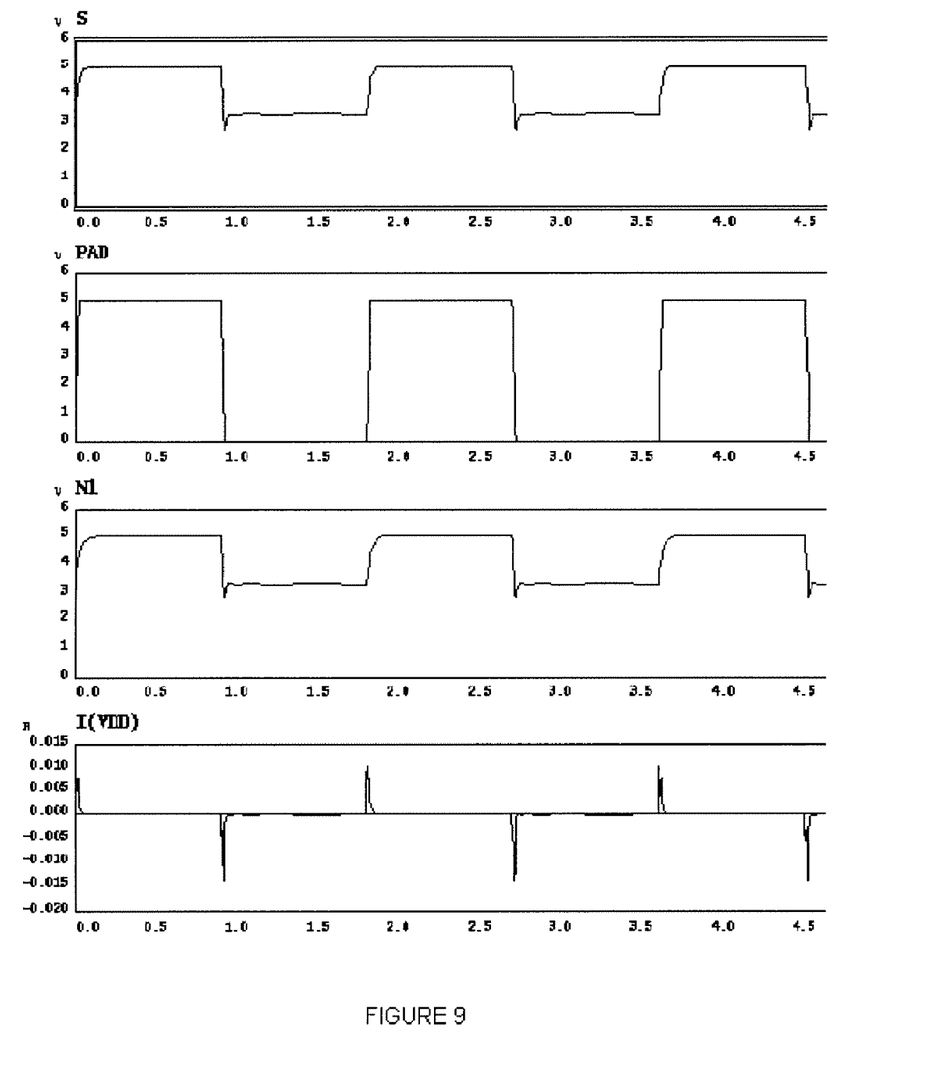
FIG. 9 shows simulation results obtained when output buffer is in tristate mode.

FIG. 9 shows simulation results obtained when output buffer is working in normal tristate mode. The first waveform gives the variation in substrate voltage. The second waveform shows the variation in PAD voltage. The third waveform shows the variation at the gate of PMOS (405). The fourth waveform shows VDD current variation. In this mode of operation, when voltage at PAD shows transition from VDD+|Vtp|, S remains at VDD. When voltage at PAD varies from VDD+|Vtp| to 5, substrate voltage follows the voltage at PAD. This is seen in the first two waveforms of FIG. 9. When PAD voltage=5 V, substrate voltage=5 V. When voltage at PAD is 0V, S remains at VDD (3.3V). Third waveform in FIG. 9 shows the variation of voltage at node N1. When voltage at PAD increases from 0 to VDD, N1 stays at VDD. As soon as the voltage at PAD crosses VDD+|Vtp|, N1 starts following PAD voltage. When PAD attains 5V, N1 also reaches at the value of 5 V. This is seen clearly in the first three waveforms of FIG. 9. The last waveform shows VDD current variation in the circuit. It can be seen that a current is generated only when PAD makes a transition from 0 to 5V or from 5V to 0V. The magnitude of the current is also very small. As a result, there is very small power dissipation in the circuit disclosed by the present invention.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an exemplary embodiment thereof, it is the intention of the following claims to encompass and include such changes.

We claim:

1. A high voltage tolerant output buffer circuit comprising:
   an output buffer for receiving an input signal from a pre-driver;
   an input/output pad coupled to the output buffer;
   a substrate voltage control circuit for maintaining the voltage S at the substrate of transistors of said output buffer;
   a first node for receiving a signal M that determines the mode of operation of the output buffer; and
   a first inverter for generating a signal W by inverting the signal M; and
   a second node for receiving the signal W,
   wherein the voltage between any two terminals of any of the transistors of the output buffer does not exceed VDD where VDD is the operating voltage of output buffer.

2. A high voltage tolerant output buffer circuit as claimed in claim 1, wherein said output buffer circuit further comprises a second inverter for inverting the input signal to the output buffer.

3. A high voltage tolerant output buffer circuit as claimed in claim 2, wherein the second inverter comprises:
a PMOS transistor having its source and bulk coupled to VDD, and
an NMOS transistor having its source and bulk coupled to ground, wherein the gates of the PMOS and NMOS transistors are coupled to form an input and the drains of the PMOS and NMOS transistors are coupled to form an output.

4. A high voltage tolerant output buffer circuit as claimed in claim 2, wherein the output buffer comprises:
a first NMOS transistor having one of its terminals coupled to the output of the inverter and gate coupled to VDD;
second and third NMOS transistors placed in series between the pad and ground, the gate of the second NMOS transistor being coupled to VDD;
a fourth NMOS transistor coupled between the gate of the third NMOS transistor and ground, the gate of the third NMOS transistor for receiving the M signal;
a transmission gate placed between the output of the second inverter and the gate of the third NMOS transistor, the gates of PMOS and NMOS transistors of the transmission gate for receiving the M and W signals, respectively;
a first PMOS transistor coupled between VDD and the pad, the gate and substrate of the first PMOS transistor being coupled to a second terminal of the first NMOS transistor and the S substrate voltage, respectively;
a second PMOS transistor coupled between the second terminal of the first NMOS transistor and the pad, the gate and substrate of the second PMOS transistor being coupled to VDD and the S substrate voltage, respectively;
third and fourth PMOS transistors coupled in series between the second terminal of the first NMOS transistor and VDD, the bulks of the PMOS transistors being coupled to VDD and the S substrate voltage, respectively, and the gates of the PMOS transistors receiving the W signal and a Z signal, respectively; and
a fifth PMOS transistor coupled between VDD and gate of the first PMOS transistor, the bulk and gate of the fifth PMOS transistor being coupled to the S substrate voltage and the pad, respectively.

5. A high voltage tolerant output buffer circuit as claimed in claim 2, wherein the output buffer comprises:
a first transmission gate coupled to the output of the second inverter, the gate of an NMOS transistor of the second inverter being connected to VDD;
a second transmission gate coupled between the gate of a PMOS transistor of the first transmission gate and the pad, both NMOS and PMOS transistors of the second transmission gate being coupled to VDD;
first and second NMOS transistors placed in series between the pad and ground, the gate of said first NMOS transistor being coupled to VDD;
a third transmission gate coupled between the output of the second inverter and the gate of the second NMOS transistor, the drain of PMOS and NMOS transistors of the third transmission gate for receiving the M and W signals, respectively;
a third NMOS transistor coupled between the gate of the second NMOS transistor and ground, the gate of the third NMOS transistor for receiving the M signal;
a first PMOS transistor coupled between VDD and PAD, its gate being coupled to a second terminal of the first transmission gate; and
a second PMOS transistor coupled between the pad and a second terminal of the first transmission gate, its gate being coupled to VDD.

6. A high voltage tolerant output buffer circuit as claimed in claim 2, wherein the output buffer comprises:
a first transmission gate coupled to the output of the second inverter, the gate of NMOS and PMOS transistors of the first transmission gate being coupled to VDD and a Z signal, respectively;
first and second NMOS transistors placed in series between the pad and ground, the gate of said first NMOS transistor being coupled to VDD;
a second transmission gate coupled between the output of the second inverter and the gate of the second NMOS transistor, the drain of PMOS and NMOS transistors of the second transmission gate for receiving the M and W signals, respectively;
a third NMOS transistor coupled between the gate of the second NMOS transistor and ground, the gate of the third NMOS transistor for receiving the M signal;
a first PMOS transistor coupled between VDD and the pad, its gate being coupled to a second terminal of the first transmission gate; and
a second PMOS transistor coupled between the pad and a second terminal of the first transmission gate, its gate being coupled to VDD.

7. A high voltage tolerant output buffer as claimed in claim 1, wherein said substrate voltage control circuitry comprises:
a first NMOS transistor having its source coupled to ground and its gate for receiving the W signal;
a second NMOS transistor having its gate coupled to VDD, a first terminal coupled to the drain of the first NMOS transistor and a second terminal coupled to a Z node;
a third NMOS transistor coupled between the pad and the Z node, the gate of the third NMOS transistor receiving the M signal;
a first PMOS transistor coupled between VDD and the substrate voltage terminal S, the gate of the first PMOS transistor being coupled to the Z node;
a second PMOS transistor coupled between the substrate voltage terminal S and the pad, its gate being coupled to VDD; and
a third PMOS transistor coupled between the pad and the gate of the first PMOS transistor, its gate being connected to VDD,
wherein the bulk of the first, second and third PMOS transistors are coupled to the substrate voltage terminal S.

8. A high voltage tolerant output buffer circuit as claimed in claim 1, wherein the high voltage output buffer operates as a normal output buffer when the M signal is low.

9. A high voltage tolerant output buffer circuit as claimed in claim 1, wherein the high voltage output buffer is tri-stated when the M signal is high.

* * * * *